(12) United States Patent
Wu et al.

(10) Patent No.: US 7,888,698 B2
(45) Date of Patent: Feb. 15, 2011

(54) PHOTOELECTRIC SEMICONDUCTOR DEVICE CAPABLE OF GENERATING UNIFORM COMPOUND LIGHTS

(75) Inventors: Chia-Hao Wu, Taipei (TW); Hung-Yuan Su, Taipei (TW)

(73) Assignees: Silitek Electronic (Guangzhou) Co., Ltd., Guangzhou (CN); Lite-On Technology Corp., Taipei (TW)

( * ) Notice: Subject to any disclaimer, the term of this patent is extended or adjusted under 35 U.S.C. 154(b) by 0 days.

(21) Appl. No.: 12/401,620

(22) Filed: Mar. 11, 2009

(65) Prior Publication Data
US 2009/0315051 A1 Dec. 24, 2009

(30) Foreign Application Priority Data
Jun. 19, 2008 (TW) .............................. 97122872 A

(51) Int. Cl.
*H01L 29/74* (2006.01)
(52) U.S. Cl. ........................... 257/98; 257/99; 257/100; 257/79
(58) Field of Classification Search .................. 257/79, 257/98, 99, 100
See application file for complete search history.

(56) References Cited

U.S. PATENT DOCUMENTS 7,153,000 B2 * 12/2006 Park et al. .................... 362/268
7,511,312 B2 * 3/2009 Chae et al. .................... 257/98

\* cited by examiner

*Primary Examiner*—Long Pham
(74) *Attorney, Agent, or Firm*—Kile Goekjian Reed & McManus PLLC

(57) ABSTRACT

A transparent layer and a phosphor layer are covered on the LED chip for increasing light emission efficiency and evenness of the LED. Based on angle-dependent emission strength of the LED chip, the phosphor layer is designed with different thickness or contains different phosphor powder concentration in different section. The lights emitted with different strength from different angle of the LED chip are transformed into uniform compound lights after passing through the phosphor layer that has different thickness or phosphor powder concentration. Micro structures capable of destroying the full reflection occurred on the incident lights are further configured on both the inner and outer surfaces of the phosphor layer to increase the light emission efficiency.

17 Claims, 6 Drawing Sheets

PHOTOELECTRIC SEMICONDUCTOR DEVICE CAPABLE OF GENERATING UNIFORM COMPOUND LIGHTS

BACKGROUND OF THE INVENTION

1. Field of the Invention

The present invention relates to a light emitting diode device, and more particularly, to a light emitting diode device with two layers and capable of generating uniform compound lights and having high light emission efficiency.

2. Description of the Prior Art

Light emitting diode (LED) has been outstanding in energy-saving lighting with its features of small size, long device lifetime, high durability, environmental friendliness, and low power consumption. Of all the LEDs, white light LED (or LED with compound lights) combines two or more monochromatic lights and has been widely used in indicating lamps and display devices in information technology, communications, and consumer electronics products. In addition to improving the light emission efficiency, the unevenness of lights from the LED also requires an urgent solution in the study of compound LED.

Please refer to FIG. 1, which is an illustration of a light emitting diode packing with a phosphor layer disclosed in the U.S. Pat. No. 6,417,019. To improve the evenness of a compound light LED, a special process is adopted to deposit an extremely thin phosphor layer 2 onto the surface of a LED chip 1 in order that the lights emitted from the chip 1 can interact immediately with the phosphor powder inside the phosphor layer 2 after travelling a negligible distance. The lights are therefore transformed into compound lights and emitted from a light package (including a reflective cup 3).

Such package structure, however, brings about some following disadvantages:

The extremely thin thickness of the phosphor layer 2 on the chip 1 greatly complicates the procedure and increases manufacture cost.

Direct covering of the phosphor layer 2 on the chip 1 puts some lights emitted from the chip 1 to reflect backward and be absorbed by the chip 1 after running into the phosphor powder.

Such process can only be utilized for flip-chip type LED.

The chip 1 emits the lights as a point light source. Although, the reflective cup 3 increases the light emission efficiency, it still narrows the light angle of the chip 1.

After improving the evenness of lights, the prior art can not further increase, or even maintain the light emission efficiency of the LED at the same time.

SUMMARY OF THE INVENTION

The present invention provides a photoelectric semiconductor device capable of generating uniform compound lights. The photoelectric semiconductor device comprises a light emitting diode (LED) chip, a base, a first layer covering on the LED chip, and a second layer covering on the first layer. The LED chip is fixed on the base. The second layer contains at least one kind of phosphor powder and comprises at least a first section and a second section wherein the first section and the second section have different thickness.

The present invention also provides a photoelectric semiconductor device capable of generating uniform compound lights. The photoelectric semiconductor device comprises a light emitting diode (LED) chip, a base, a first layer covering on the LED chip, and a second layer covering on the first layer. The LED chip is fixed on the base. The second layer contains at least one kind of phosphor powder and comprises at least a first section and a second section wherein the first section and the second section have different phosphor powder concentration.

The present invention also provides a photoelectric semiconductor device capable of generating uniform compound lights. The photoelectric semiconductor device comprises a light emitting diode (LED) chip, a base, a first layer covering on the LED chip, and a second layer covering on the first layer. The LED chip is fixed on the base. The second layer contains at least one kind of phosphor powder and comprises a first surface and a second surface wherein the first surface and the second surface both or respectively comprise radial-distributing micro structures.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims to refer to particular system components. As one skilled in the art will appreciate, manufacturers may refer to a component by different names. In the following discussion and in the claims, the terms "include" and "comprise" are used in an open-ended fashion. Also, the term "couple" is intended to mean either an indirect or direct electrical connection. Thus, if a first device is coupled to a second device, that connection may be through a direct electrical connection, or through an indirect electrical connection via other devices and connections.

Figure 1:
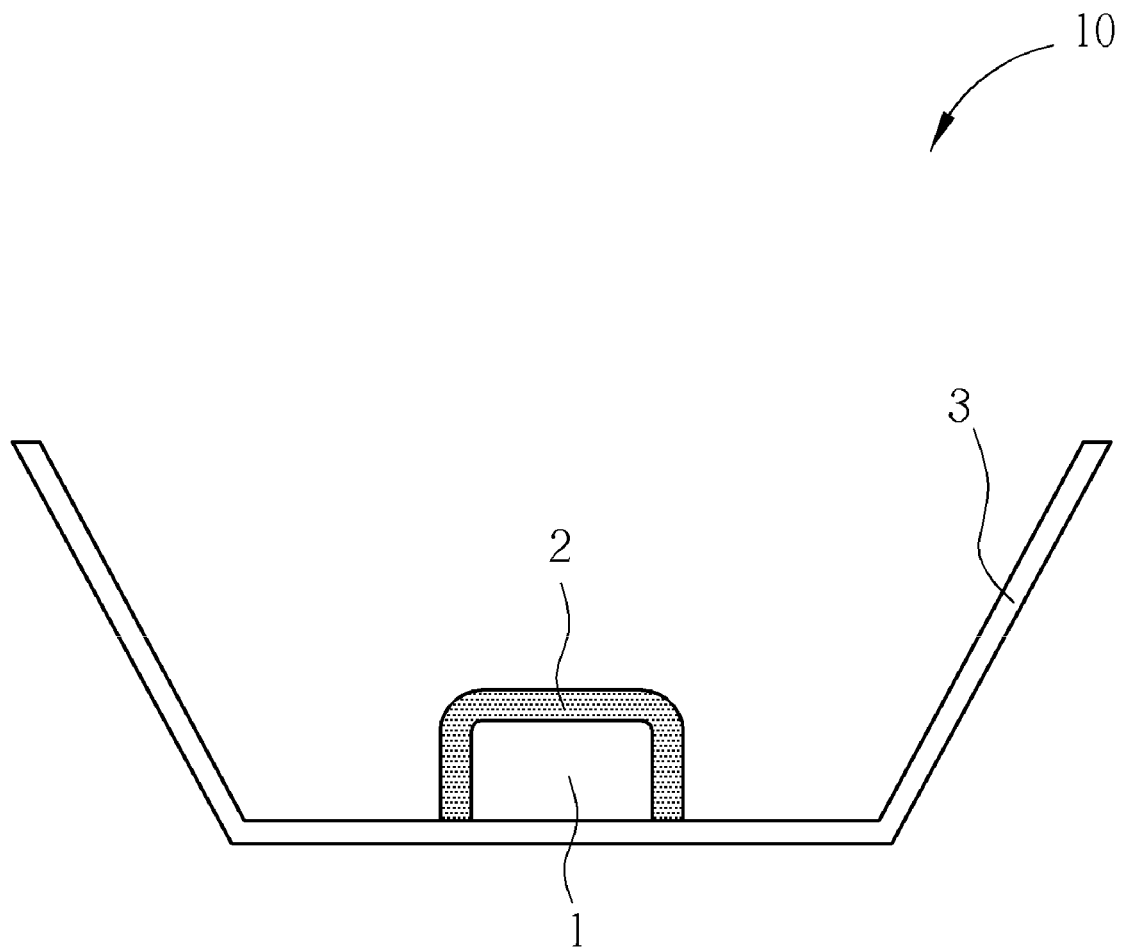
FIG. 1 is an illustration of the cross-section view of a prior art light emitting diode.
Figure 2:
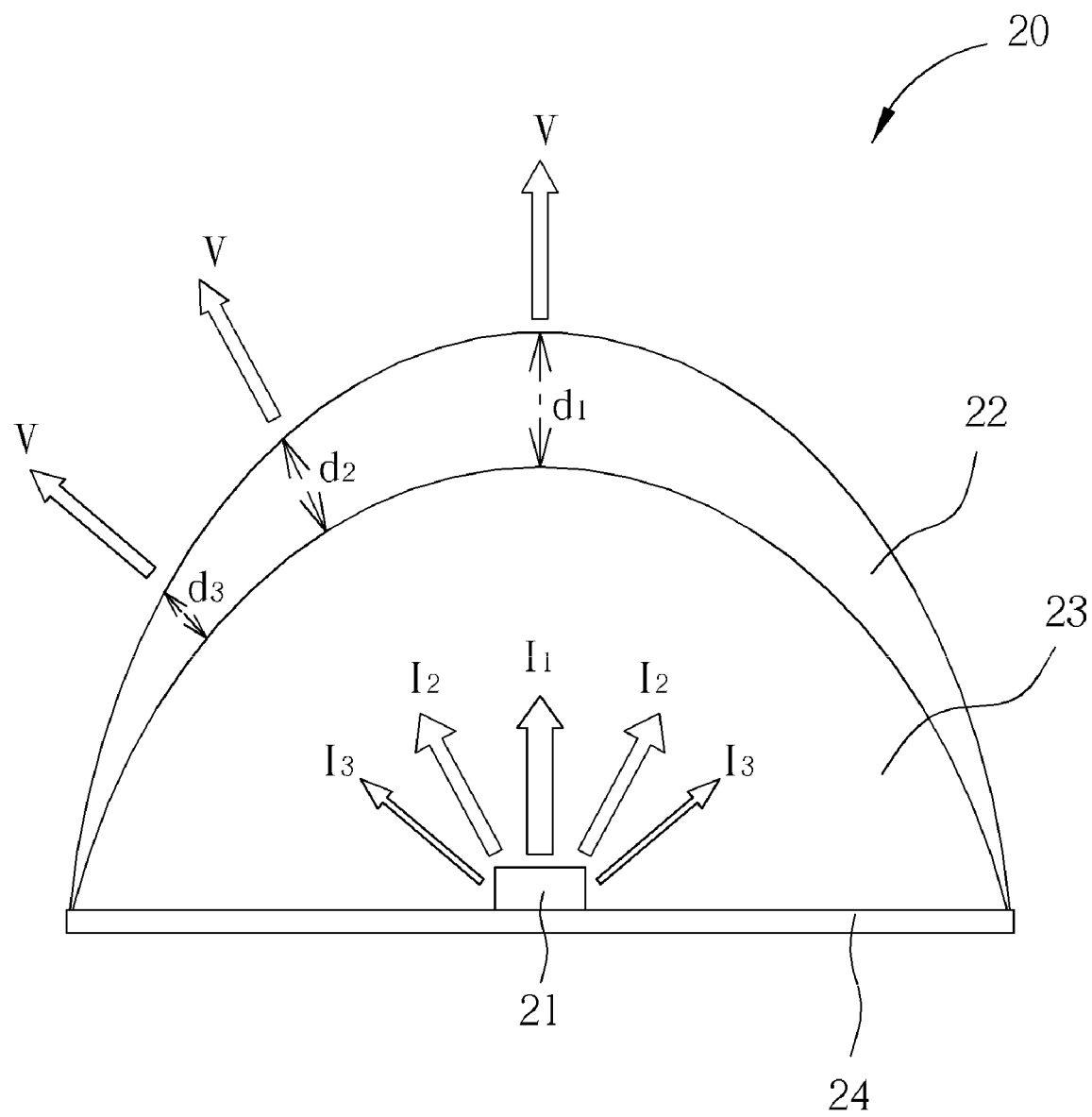
FIG. 2 is an illustration of a first exemplary embodiment of a light emitting diode capable of generating uniform compound lights according to the present invention.

Please refer to FIG. 2. FIG. 2 is an illustration of a first exemplary embodiment of a light emitting diode (LED) 20 capable of generating uniform compound lights according to the present invention. The LED 20 includes a chip 21, a base 24, a first layer 23, and a second layer 22. The chip 21 is fixed on the base 24 and can be chips of direct-emitting, lateral-emitting, or flip-chip forms that can emit 400 nm 470 nm blue lights or 300 nm 400 nm ultraviolet lights. The base 24 can be a metal substrate, a printed circuit board (PCB), a ceramic substrate, a high polymer plastic substrate, a plastic leaded chip carrier (PCLL), or a substrate formed by other compound material. The inner first layer 23 covers directly on the chip 21 and in the embodiment, the first layer 23 can be transparent high polymer colloid such as epoxide, silica gel, or other high polymer compound and is used for separating the chip 21 and the second layer 22 to enhance the light emission efficiency. The transparent feature of the first layer 23 ensures that the lights emitted by the chip 21 not be absorbed inside the first layer 23. FIG. 2 shows that the second layer 22 that contains phosphor powder is covering on the first layer 23. The second layer 22 can contain different phosphor powders that can emit red lights (590 nm~650 nm), green lights (500 nm~530 nm), or blue lights (440 nm~480 nm) or can transform the emitted lights from the chip 21 into compound lights having 520 nm~570 nm wavelength. In the embodiment according to the present invention, the second layer 22 can be a lens that contains one or more kinds of phosphor powder and whose largest thickness is small than or equal to 0.5 mm. The chip 21 emits lights with different strength at different angle. FIG. 2 shows that the light emitting strength of the chip 21 is I1>I2>I3. The second layer 22 is designed to have different thickness in different section corresponding to different light emitting angle to generate uniform compound lights after the light passing through the second layer 22. For example, a first section of the second layer 22 has thickness d1 that corresponds to the light emitting strength I1, a second section has thickness d2 that corresponds to the light emitting strength I2, and a third section has thickness d3 that corresponds to the light emitting strength I3. In the first embodiment, d1>d2>d3, and the thickness of each section is further designed to satisfy the following relation: I1/d1=I2/d2=I3/d3=V, such that the LED 20 has the same light emitting strength V at each angle. Practically, the thickness variation of the second layer 22 can be a gradual change as shown in FIG. 2 for more precisely reflecting the light emitting strength of the chip 21, while the description takes three sections simply for descriptive purpose.

Figure 3:
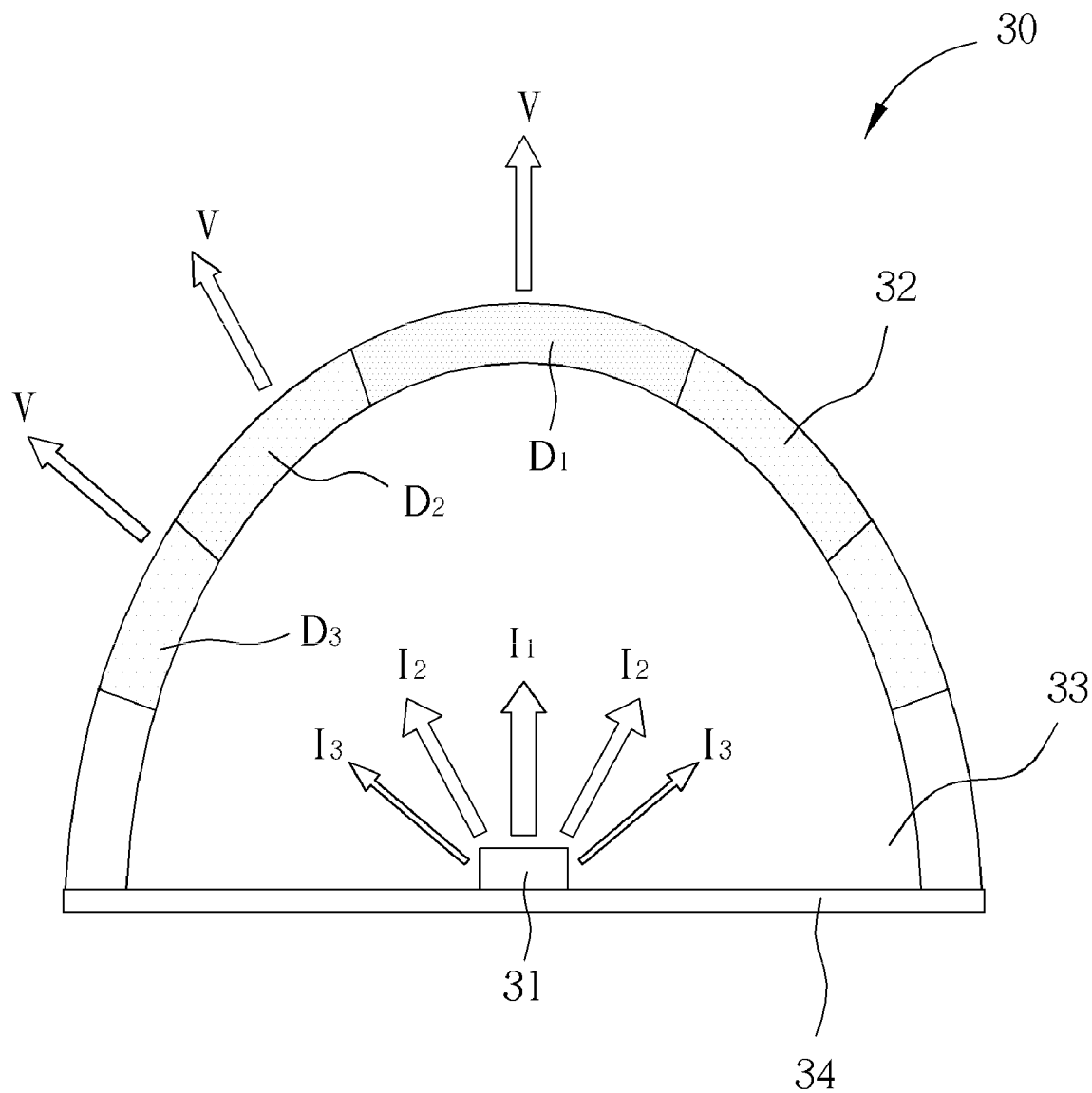
FIG. 3 is an illustration of a second exemplary embodiment of the light emitting diode capable of generating uniform compound lights according to the present invention.

Please refer to FIG. 3. FIG. 3 is an illustration of a second exemplary embodiment of a light emitting diode (LED) 30 capable of generating uniform compound lights according to the present invention. The LED 30 includes a chip 31, a base 34, a first layer 33, and a second layer 32, where the chip 31 is fixed on the base 34. The second layer 32 is designed to have different concentration of phosphor powder in different section corresponding to different light emitting angle to generate uniform compound lights after the light passing through the second layer 32. For example, a first section of the second layer 32 has concentration D1 that corresponds to the light emitting strength I1, a second section has concentration D2 that corresponds to the light emitting strength I2, and a third section has concentration D3 that corresponds to the light emitting strength I3. In the second embodiment, D1>D2>D3, and the concentration of each section is further designed to satisfy the following relation: I1/D1=I2/D2=I3/D3=V, such that the LED 30 has the same light emitting strength V at each angle. Practically, the concentration variation of the second layer 32 can be a gradual change as shown in FIG. 3 for more precisely reflecting the light emitting strength of the chip 31, while the description takes three sections simply for descriptive purpose.

Figure 4:
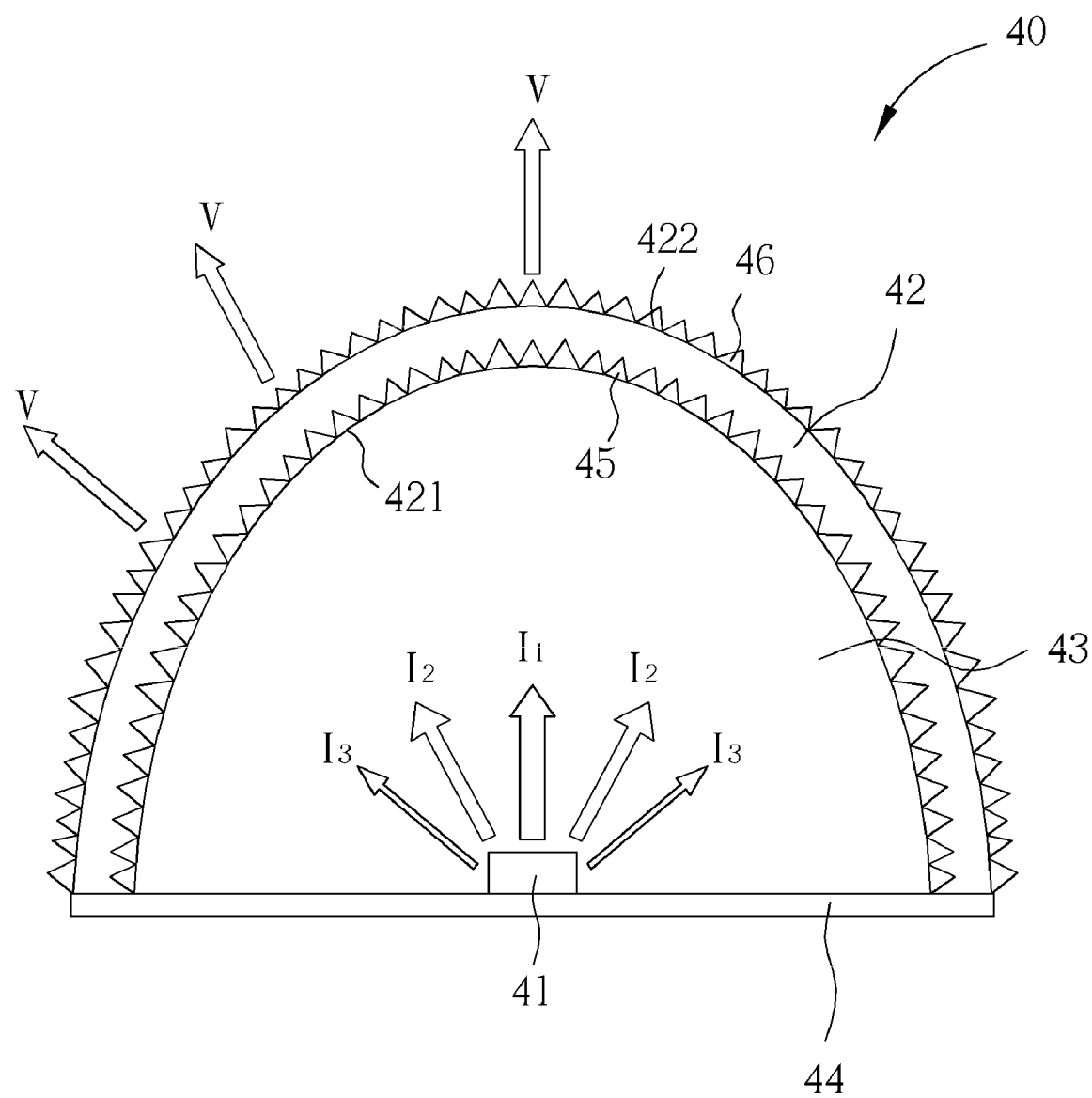
FIG. 4 is an illustration of a third exemplary embodiment of the light emitting diode capable of generating uniform compound lights according to the present invention.

Please refer to FIG. 4. FIG. 4 is an illustration of a third exemplary embodiment of a light emitting diode (LED) 40 capable of generating uniform compound lights according to the present invention. For the two-layer LED package structure disclosed in the present invention, including the aforementioned first and second embodiments and the following fourth and fifth embodiments, the first layer and the second layer that cover on the chip usually take the convex form for maximum light emitting angle. As FIG. 4 shows, the LED 40 includes a chip 41, a base 44, a first layer 43, and a second layer 42. The chip 41 is fixed on the base 44. Since a fraction of the lights emitted by the chip 41 has backward scattering when running into the phosphor powder inside the second 42, or some lights have total reflection when entering from the first layer 43 into the second layer 42 or from the second layer 42 into the air and turn out to be absorbed by the chip 41 again, the light emission efficiency can be downgraded. In the fourth embodiment, the LED 40 has a plurality of radial-distributing first micro structure 45 formed with pyramid, Tetrahedron, cone, or circular waveform on a first surface 421 of the second layer 42 that contact the first layer 43 and/or a plurality of radial-distributing second micro structure 46 formed with pyramid, Tetrahedron, cone, or circular waveform on a second surface 422 of the second layer 42 that contacts the air. The first micro structure 45 on the first surface 421 prevents the lights from total reflecting when entering from the first layer 43 into the second layer 42 and further re-reflects the backward scattering of the lights that run into the phosphor powder so that more lights can be put to emit outward. The second micro structure 46 on the second surface 422 prevents the lights from total reflecting when entering from the second layer 42 into the air and more lights can be put to emit outward. The LED 40 can have the first micro structure 45 and the second micro structure 46 both existing on the surfaces of the second layer 42 or just configures the first micro structure 45 or the second micro structure 46 on the surface of the second layer 42.

Figure 5:
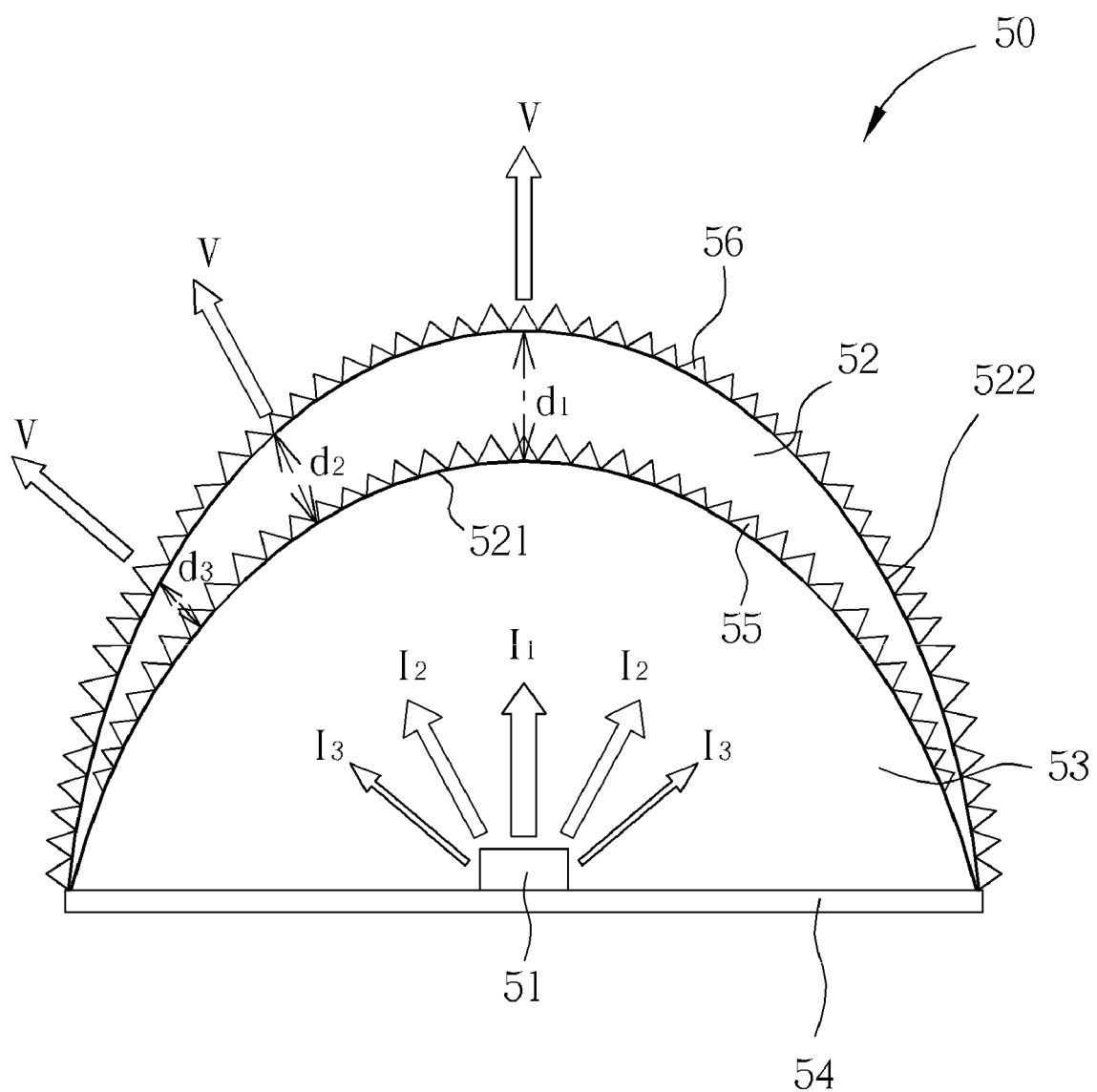
FIG. 5 is an illustration of a fourth exemplary embodiment of the light emitting diode capable of generating uniform compound lights according to the present invention.

Please refer to FIG. 5. FIG. 5 is an illustration of a fourth exemplary embodiment of a light emitting diode (LED) 50 capable of generating uniform compound lights according to the present invention. The LED 50 includes a chip 51, a base 54, a first layer 53, and a second layer 52. The chip 51 is fixed on the base 54. The second layer 52 is substantially the same as the second layer 22 in FIG. 2. A first surface 521 and a second surface 522 of the second layer 52 also have a first micro structure 55 and a second micro structure 56 respectively, which are similar to the first micro structure 45 and the second micro structure 46 in the third embodiment. The LED 50 in the fourth embodiment uses the second layer 52 with thickness variation and the first micro structure 55 and the second micro structure 56 on the surfaces of the second layer 52 for emitting uniform compound lights and enhances light emission efficiency.

Figure 6:
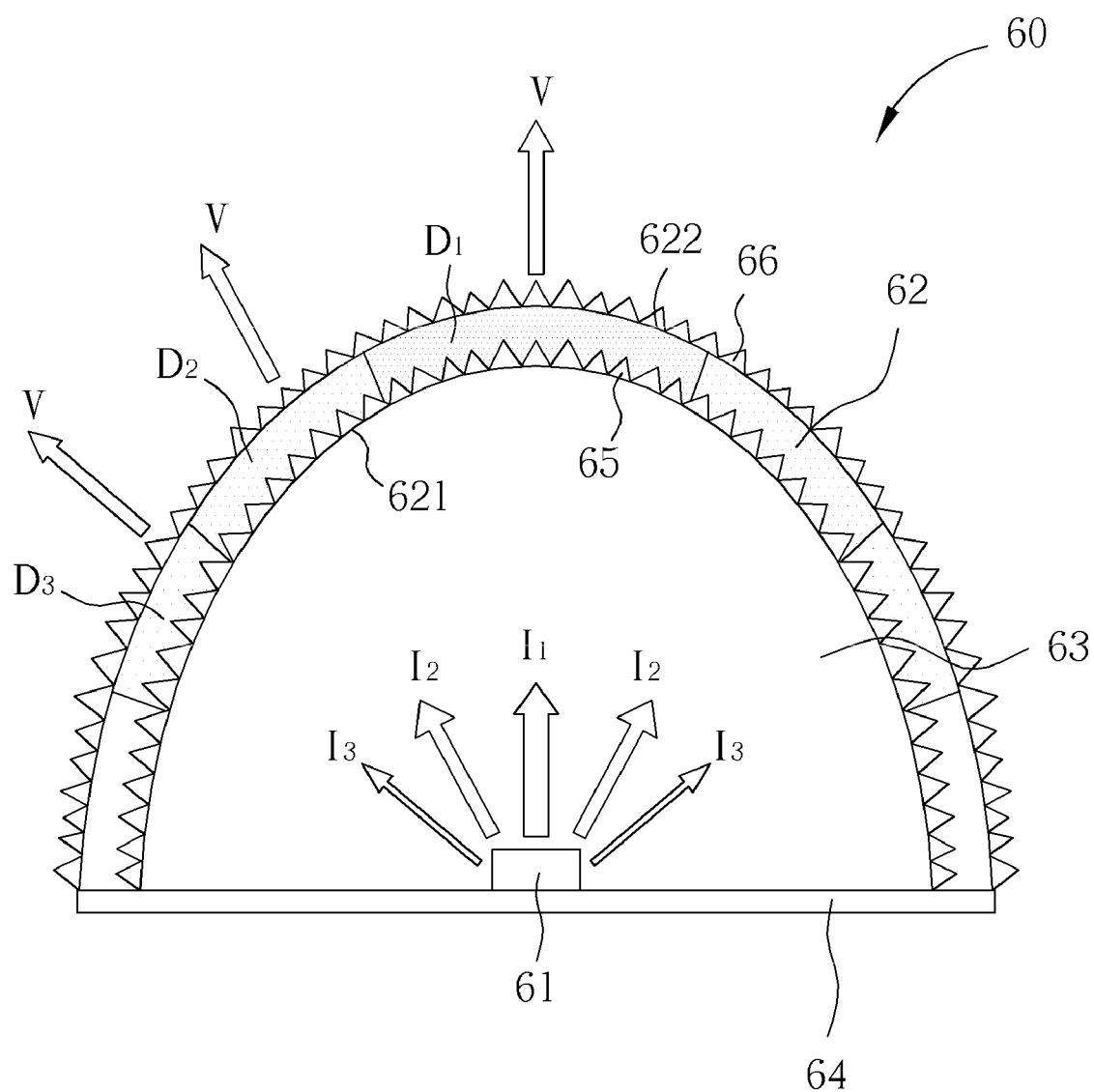
FIG. 6 is an illustration of a fifth exemplary embodiment of the light emitting diode capable of generating uniform compound lights according to the present invention.

Please refer to FIG. 6. FIG. 6 is an illustration of a fifth exemplary embodiment of a light emitting diode (LED) 60 capable of generating uniform compound lights according to the present invention. The LED 60 includes a chip 61, a base 64, a first layer 63, and a second layer 62. The chip 61 is fixed on the base 64. The second layer 62 is substantially the same as the second layer 32 in FIG. 3. A first surface 621 and a second surface 622 of the second layer 62 also have a first micro structure 65 and a second micro structure 66 respectively, which are similar to the first micro structure 45 and the second micro structure 46 in the third embodiment. The LED 60 in the fifth embodiment uses the second layer 62 with phosphor powder concentration variation and the first micro structure 65 and the second micro structure 66 on the surfaces of the second layer 62 for emitting uniform compound lights and enhances light emission efficiency.

Each embodiment mentioned above no longer configures a reflective cup outside the LED chip as the prior art and the lights emitted by the chip are not blocked or altered in the direction, which efficiently promotes the angle of light of the LED in the present invention.

The light emitting diode device disclosed in the present invention uses a transparent layer and a phosphor layer covering on the LED chip for increasing light emission efficiency and evenness of the LED chip. Based on angle-dependent emission strength of the LED chip, the phosphor layer is designed with different thickness or contains different phosphor powder concentration in different section. The lights emitted with different strength from different angle of the LED chip are transformed into uniform compound lights after passing through the phosphor layer that has different thickness or phosphor powder concentration. Micro structures capable of destroying the full reflection occurred on the incident lights are further configured on both the inner and outer surfaces of the phosphor layer to increase the light emission efficiency.

Those skilled in the art will readily observe that numerous modifications and alterations of the device and method may be made while retaining the teachings of the invention.

What is claimed is:

1. A photoelectric semiconductor device capable of generating uniform compound lights, comprising:
    a light emitting diode (LED) chip;
    a base, the LED chip fixed on the base;
    a first layer covering on the LED chip, wherein the first layer is transparent high polymer colloid; and
    a second layer covering on the first layer and containing at least one kind of phosphor powder, the second layer comprising at least a first section and a second section wherein the first section and the second section have different thickness.

2. The photoelectric semiconductor device of claim 1, wherein the LED chip is utilized for emitting 400 nm~470 nm blue lights or 300 nm~400 nm ultraviolet lights.

3. The photoelectric semiconductor device of claim 1, wherein the chip is an light emitting diode chip with direct-emitting, lateral-emitting, or flip-chip forms.

4. The photoelectric semiconductor device of claim 1, wherein the base is a metal substrate, a printed circuit board (PCB), a ceramic substrate, a high polymer plastic substrate, a plastic leaded chip carrier (PCLL), or a substrate formed by other compound material.

5. The photoelectric semiconductor device of claim 1, wherein the first layer is epoxide, silica gel, or other high polymer compound.

6. The photoelectric semiconductor device of claim 1, wherein the second layer is a phosphor layer, the first section and the second section corresponding to different light emission angle of the LED chip.

7. The photoelectric semiconductor device of claim 6, wherein the first section and the second section of the second layer contain different phosphor powder concentration.

8. The photoelectric semiconductor device of claim 1, wherein the second layer is utilized for transforming the emitted lights from the LED chip into compound lights having 520 nm~570 nm wavelength.

9. The photoelectric semiconductor device of claim 1, wherein the second layer contains phosphor powder that can emit red lights (590 µm~650 nm), green lights (500 nm~530 nm), or blue lights (440 nm~480 nm).

10. The photoelectric semiconductor device of claim 1, wherein the second layer is a lens.

11. The photoelectric semiconductor device of claim 1, wherein the second layer further comprises a first surface and a second surface, the first surface contacting the surface of the first layer, the first surface and the second surface being convex.

12. The photoelectric semiconductor device of claim 11, wherein the first surface and the second surface of the second layer both or respectively comprise radial-distributing micro structures formed with pyramid, Tetrahedron, cone, or circular waveform.

13. The photoelectric semiconductor device of claim 12, wherein the largest thickness of the second layer is small than or equal to 0.5 mm.

14. A photoelectric semiconductor device capable of generating uniform compound lights, comprising:
    a light emitting diode (LED) chip;
    a base, the LED chip fixed on the base;
    a first layer covering on the LED chip, wherein the first layer is transparent high polymer colloid; and
    a second layer covering on the first layer and containing at least one kind of phosphor powder, the second layer comprising a first surface and a second surface wherein the first surface and the second surface both or respectively comprise radial-distributing micro structures.

15. The photoelectric semiconductor device of claim 14, wherein the micro structures of the first surface and the second surface are formed with pyramid, Tetrahedron, cone, or circular waveform.

16. The photoelectric semiconductor device of claim 14, wherein the second layer further comprises at least a first section and a second section having different thickness.

17. The photoelectric semiconductor device of claim 14, wherein the second layer further comprises at least a first section and a second section having different phosphor powder concentration.

* * * * *